US011121200B2

(12) United States Patent
Fan et al.

(10) Patent No.: US 11,121,200 B2
(45) Date of Patent: Sep. 14, 2021

(54) ARRAY SUBSTRATE, DISPLAY DEVICE AND PEEP PREVENTION METHOD THEREOF (71) Applicant: BOE TECHNOLOGY GROUP CO., LTD., Beijing (CN)

(72) Inventors: Xing Fan, Beijing (CN); Yansong Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 223 days.

(21) Appl. No.: 16/349,135

(22) PCT Filed: Oct. 31, 2018

(86) PCT No.: PCT/CN2018/113035
§ 371 (c)(1),
(2) Date: May 10, 2019

(87) PCT Pub. No.: WO2019/200889
PCT Pub. Date: Oct. 24, 2019

(65) Prior Publication Data
US 2020/0266257 A1    Aug. 20, 2020

(30) Foreign Application Priority Data

Apr. 20, 2018   (CN) .......................... 201810361764.1

(51) Int. Cl.
H01L 29/08    (2006.01)
H01L 27/32    (2006.01)
(Continued)

(52) U.S. Cl.
CPC .... *H01L 27/3272* (2013.01); *G02F 1/133512* (2013.01); *G02F 1/133514* (2013.01);
(Continued)

(58) Field of Classification Search
CPC .............. H01L 27/322; H01L 27/3246; H01L 27/3272; H01L 27/3283; H01L 51/5284; G02F 1/133512; G02F 1/133514
(Continued)

(56) References Cited

U.S. PATENT DOCUMENTS 6,224,448 B1 *  5/2001  Tada ................... H01L 27/3211
                                                           445/24
8,325,301 B2    12/2012  Woo et al.
(Continued)

FOREIGN PATENT DOCUMENTS

CN      101344668 A     1/2009
CN      104090377 A     10/2014
(Continued)

OTHER PUBLICATIONS

Chinese Office Action in Chinese Application No. 201810361764.1, dated Sep. 10, 2020 with English translation.
(Continued)

*Primary Examiner* — Brook Kebede
(74) *Attorney, Agent, or Firm* — Collard & Roe, P.C.

(57) ABSTRACT

A display substrate, a display device, and a peep prevention method thereof. The display substrate includes: a base substrate; a plurality of pixel units on the base substrate and including a plurality of first pixel units; and a light shielding portion positioned between two adjacent first pixel units.

19 Claims, 6 Drawing Sheets (51) Int. Cl.
*G02F 1/1335* (2006.01)
*H01L 51/52* (2006.01)
(52) U.S. Cl.
CPC ........ *H01L 27/322* (2013.01); *H01L 27/3246* (2013.01); *H01L 27/3283* (2013.01); *H01L 51/5284* (2013.01)
(58) Field of Classification Search
USPC .......................................................... 257/40
See application file for complete search history.

(56) References Cited

U.S. PATENT DOCUMENTS

| | | | |
|---|---|---|---|
| 9,557,559 | B2 | 1/2017 | Wang et al. |
| 10,203,540 | B2 | 2/2019 | Fu et al. |
| 2009/0309821 | A1* | 12/2009 | Tanno .................. H01L 27/326 345/87 |
| 2015/0090991 | A1 | 4/2015 | Ishii et al. |

FOREIGN PATENT DOCUMENTS

| | | |
|---|---|---|
| CN | 104808410 A | 7/2015 |
| CN | 107316888 A | 11/2017 |
| CN | 108493223 A | 9/2018 |

OTHER PUBLICATIONS

International Search Report of PCT/CN2018/113035 in Chinese, dated Dec. 20, 2018, with English translation.
Notice of Transmittal of the International Search Report of PCT/CN2018/113035 in Chinese, dated Dec. 20, 2018.
Written Opinion of the International Searching Authority of PCT/CN2018/113035 in Chinese, dated Dec. 20, 2018 with English translation.

* cited by examiner

ARRAY SUBSTRATE, DISPLAY DEVICE AND PEEP PREVENTION METHOD THEREOF

CROSS REFERENCE TO RELATED APPLICATIONS

This application is the National Stage of PCT/CN2018/113035 filed on Oct. 31, 2018, which claims priority under 35 U.S.C. § 119 of Chinese Application No. 201810361764.1 filed on Apr. 20, 2018, the disclosure of which is incorporated by reference.

TECHNICAL FIELD

Embodiments of the disclosure relate to the technical field of display, in particular to a display substrate, a display device, and a peep prevention method thereof.

BACKGROUND

In modern society, it is very common to use computers and mobile phones in public places. With the development of network technology, more and more people carry out shopping or account transactions on the network. During the above operations, operators often need to input personal information on the display devices such as computers, mobile phones, automatic teller machines, automatic ticket picking machines, etc., thus it is easy to cause personal information disclosure. Therefore, the anti-peeping performance of display devices has received more and more attention.

SUMMARY

Embodiments of the disclosure provide a display substrate, a display device, and an anti-peep method thereof, which can realize an anti-peep function on the basis of not affecting the brightness and touch sensitivity of the display device.

According to a first aspect of the present disclosure, there is provided a display substrate comprising:
 a base substrate;
 a plurality of pixel units on the base substrate, the plurality of pixel units comprising a plurality of first pixel units; and
 a light shielding portion between two adjacent first pixel units.

In at least some embodiments, the plurality of pixel units further comprise a plurality of second pixel units, and the light shielding portion is not provided between two adjacent second pixel units.

In at least some embodiments, the light shielding portion comprises a plurality of first light shielding portions, wherein the plurality of first pixel units are arranged in a first direction, and each first light shielding portion is located between two adjacent first pixel units arranged in the first direction.

In at least some embodiments, each first pixel unit comprises a plurality of sub-pixels, and the first light shielding portion is disposed between two adjacent sub-pixels of each first pixel unit.

In at least some embodiments, the plurality of first light shielding portions are parallel to each other and extend in a second direction, the second direction is perpendicular to the first direction, and the first direction and the second direction are both located in a plane where the base substrate is located.

In at least some embodiments, the display substrate further comprises a plurality of second light shielding portions, wherein each second light shielding portion is located between the first pixel unit and a pixel unit adjacent to the first pixel unit in a second direction, the second direction is perpendicular to the first direction, and both the first direction and the second direction are located in a plane of the base substrate.

In at least some embodiments, the display substrate further comprises a pixel defining layer on the base substrate, the pixel defining layer is configured for defining a plurality of sub-pixel regions, and the light shielding portion is arranged on a side of the pixel defining layer away from the base substrate.

In at least some embodiments, the light shielding portion is only located between the two adjacent first pixel units, and a sum of thicknesses of the pixel defining layer and the light shielding portion in a direction perpendicular to a plane of the base substrate is greater than or equal to a distance between the light shielding portion and a center of the first pixel unit closest to the light shielding portion.

In at least some embodiments, the light shielding portion is located between the two adjacent first pixel units and between two adjacent sub-pixels of each first pixel unit, and a sum of thicknesses of the pixel defining layer and the light shielding portion in a direction perpendicular to the plane of the base substrate is greater than or equal to a distance from a center of the sub-pixel of the first pixel unit to the first light shielding portion closest to the sub-pixel.

In at least some embodiments, a height of the light shielding portion relative to the base substrate is greater than or equal to a distance from a center of the pixel unit closest to the light shielding portion to the light shielding portion.

In at least some embodiments, the first light shielding portion extends along the second direction, and a length of the first light shielding portion in the second direction is greater than or equal to a length of the first pixel unit in the second direction.

In at least some embodiments, the second light shielding portion extends along the first direction, and a length of the second light shielding portion in the first direction is greater than or equal to a width of the first pixel unit in the first direction.

In at least some embodiments, the first direction is a row direction, the second direction is a column direction, and the plurality of pixel units comprise a plurality of rows of first pixel units and a plurality of rows of second pixel units, wherein the second pixel units and the first pixel units are alternately arranged in the column direction.

In at least some embodiments, the first direction is a row direction, the second direction is a column direction, and the plurality of pixel units comprise a plurality of rows of first pixel units and a plurality of rows of second pixel units, wherein the plurality of rows of first pixel units are adjacent to each other in the column direction, and the plurality of rows of second pixel units are adjacent to each other in the column direction.

According to a second aspect of the present disclosure, there is provided a display device comprising the above-mentioned display substrate.

In at least some embodiments, the display substrate is an organic electroluminescent array substrate, and the organic electroluminescent array substrate comprises: a plurality of organic electroluminescent units on the base substrate, and each organic electroluminescent unit comprising a sub-pixel region; and a pixel defining layer configured to define a plurality of sub-pixel regions of the organic electroluminescent unit; wherein the light shielding portion is located at a side of the pixel defining layer away from the base substrate.

In at least some embodiments, an orthographic projection of the light shielding portion on the base substrate is within an orthographic projection of the pixel defining layer on the base substrate.

In at least some embodiments, the display substrate is a color filter substrate, and the color filter substrate comprises: a plurality of color filter units; and a black matrix located between the plurality of color filter units and configured to space the plurality of color filter units; wherein the light shielding portion is positioned on a side of the base substrate opposite to the black matrix and the plurality of color filter units.

According to a third aspect of the present disclosure, there is provided a peep prevention method of the above display device, comprising:

lighting only the plurality of first pixel units to make the display device in a peep-proof state.

In at least some embodiments, the peep prevention method of the display device further comprises: lighting all the plurality of pixel units to make the display device in a normal display state.

BRIEF DESCRIPTION OF THE DRAWINGS

In order to more clearly explain the technical scheme of the embodiments of the present disclosure, the following will briefly introduce the drawings of the embodiments. Obviously, the drawings in the following description only refer to some embodiments of the present disclosure, and not to the limitations of the present disclosure.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

A peep prevention film is pasted on the display device to block light rays at a certain angle, thereby achieving the peep prevention function. However, since the peep prevention film has a thickness of about 0.25 mm, on the one hand, the peep prevention film reduces the brightness of the display device; on the other hand, if the display device has a touch function, the peep prevention film will reduce the touch sensitivity of the display device.

The embodiment of the disclosure provides a display substrate, which comprises: a base substrate; a plurality of pixel units located on the base substrate and including a plurality of first pixel units; and a light shielding portion positioned between two adjacent first pixel units.

In the above-mentioned display panel, by arranging a light shielding portion between adjacent first pixel units, a part of large-angle light can be shielded by the light shielding portion, so that the part of light cannot be emitted from the display device and used to display. When the viewing angle of the user is within the angle range of the shielded light, the displayed picture becomes blurred due to too low brightness, thereby playing a peep prevention role at the viewing angle, so that the display device realizes peep prevention.

In at least some embodiments, the display panel may be a color filter substrate of a Liquid Crystal Display (LCD) or a self-luminous array substrate. For example, the self-luminous array substrate may be an Organic Light-Emitting Diode (OLED) array substrate or a quantum dot electroluminescent array substrate.

For example, as illustrated in FIG. 1 to FIG. 4, the display substrate includes a base substrate 10; a plurality of pixel units disposed on the base substrate 10, the plurality of pixel units including a plurality of first pixel units 11; and first light shielding portions 21 each located between adjacent first pixel units 11.

Figure 1:
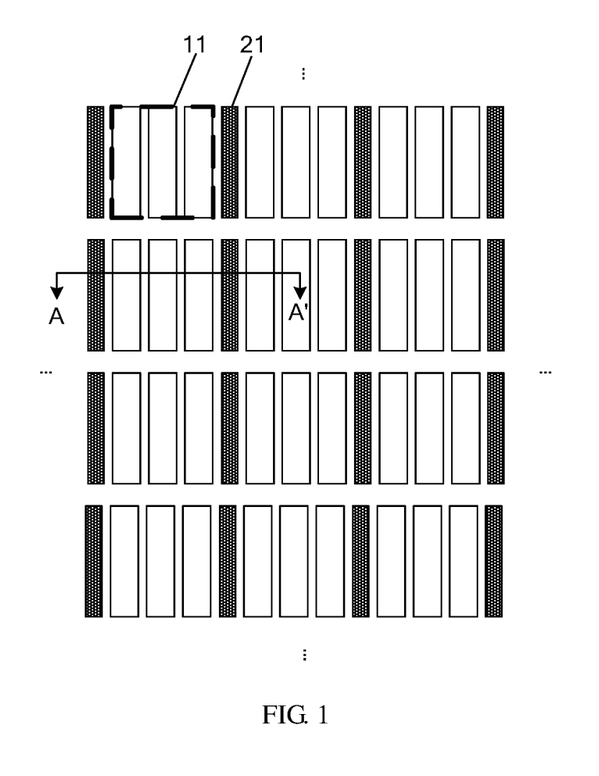
FIG. 1 is a top view of a display substrate provided by an embodiment of the disclosure.

As illustrated in FIG. 1, the first pixel units 11 are arranged in a first direction (e.g., a row direction), thus forming a plurality of rows of first pixel units 11, each first light shielding portion 21 being located between two adjacent first pixel units 11 arranged in the row direction.

In at least some embodiments, the plurality of pixel units further include a plurality of second pixel units, and the first light shielding portion is not provided between two adjacent second pixel units. This can ensure the normal display of the display device, i.e. the non-peep-proof state.

Figure 2:
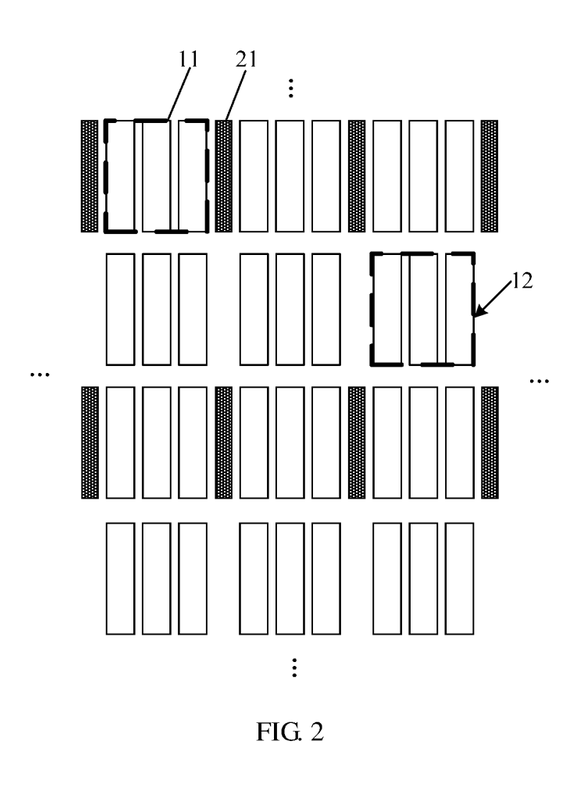
FIG. 2 is a top view of another display substrate provided by an embodiment of the disclosure.
Figure 3:
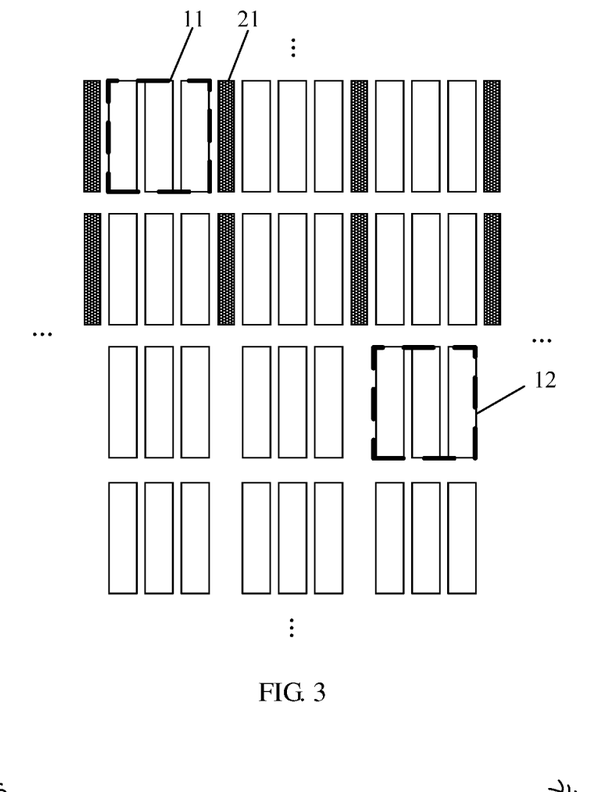
FIG. 3 is a top view of still another display substrate provided by an embodiment of the disclosure.

For example, as illustrated in FIG. 2 and FIG. 3, the plurality of pixel units further include a plurality of second pixel units 12, and the first light shielding portion 21 is not provided between two adjacent second pixel units 12. The plurality of second pixel units 12 may also be arranged in the row direction to form a plurality of rows of second pixel units. For example, a plurality of rows of pixel units include both a plurality of rows of first pixel units 11 and a plurality of rows of second pixel units 12, and no first light shielding portion 21 is provided between adjacent second pixel units 12.

For example, as illustrated in FIG. 2, in the plurality of rows of pixel units, one row of first pixel units 11 is provided every other row. In an example, odd rows are provided with first pixel units 11 and even rows are provided with second pixel units 12; alternatively, odd rows are provided with second pixel units 12, and even rows are provided with first pixel units 11. In this way, the first pixel unit 11 and the second pixel unit 12 are arranged at intervals in the column direction, as a result, when the display substrate is applied to a display device, only the first pixel unit 11 or only the second pixel unit 12 is operated, which does not affect the full screen display of the display device.

For example, as illustrated in FIG. 3, a plurality of rows of first pixel units 11 are adjacent to each other, and a plurality of rows of second pixel units 12 are adjacent to each other, so that the plurality of rows of first pixel units 11 and the plurality of rows of second pixel units 12 are respectively located in two regions of the display substrate, such as the first pixel region A and the second pixel region B. By way of example, the upper half of the display screen of the display device corresponds to the first pixel unit 11, and the lower half corresponds to the second pixel unit 12. Thus, when the display device turns on the peep-proof mode, only the first pixel unit 11 located in the upper half of the display screen is put into operation, so that the upper half of the display screen has the peep prevention function when displaying a picture.

It can be understood that in the case where the plurality of rows of pixel units include both the plurality of rows of first pixel units 11 and the plurality of rows of second pixel units 12, the plurality of rows of first pixel units 11 and the plurality of rows of second pixel units 12 may be arranged in other arrangements than those illustrated in FIGS. 2 and 3, and the embodiment of the present disclosure is not limited thereto, such as being alternately arranged in the column direction or being arranged in left and right portions of the display substrate respectively.

Figure 4:
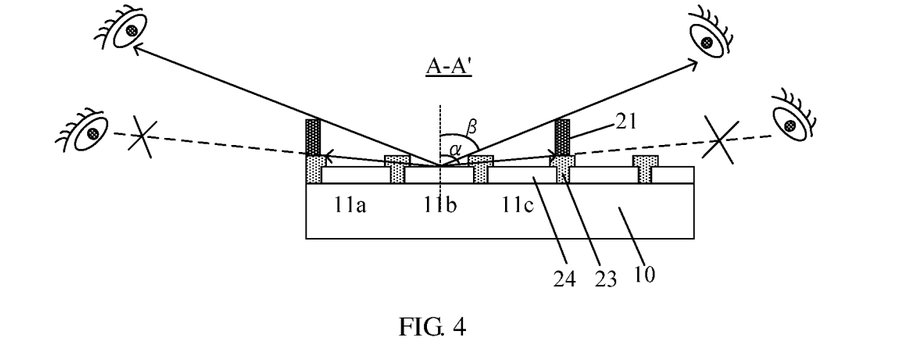
FIG. 4 is a cross-sectional view of the display substrate of FIG. 1 taken along line A-A'.
Figure 9:
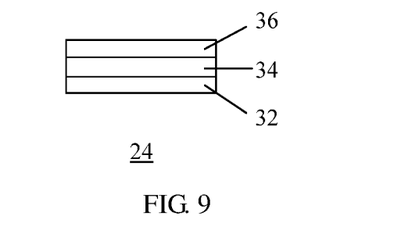
FIG. 9 is a schematic structural diagram of an organic electroluminescent unit according to an embodiment of the present disclosure.

In at least some embodiments, as illustrated in FIG. 4, the display substrate is an OLED array substrate including a base substrate 10, a plurality of OLED light emitting units 24, and a pixel defining layer 23, each OLED light emitting unit including one sub-pixel region (e.g., sub-pixel region 11a, 11b, or 11c), and the pixel defining layer 23 is configured to define a plurality of sub-pixel regions. The OLED light emitting units 24 are configured to emit light for display. As illustrated in FIG. 9, each OLED light emitting unit 24 includes an anode 32, a cathode 36, and a light emitting functional layer 34 located between the anode 32 and the cathode 36. For example, the OLED light emitting unit may emit red, green, or blue light, respectively. The OLED array substrate further includes a first light shielding portion 21 disposed on a side of the pixel defining layer 23 away from the base substrate 10. For example, the orthographic projection of the first light shielding portion 21 on the base substrate 10 is located in the orthographic projection of the pixel defining layer 23 on the base substrate 10.

For example, the pixel defining layer 23 may be made of a light-transmitting material or an opaque material. When the pixel defining layer 23 is made of a light-transmitting material, the light incident on the pixel defining layer 23 cannot be emitted for display due to total reflection. When the pixel defining layer 23 is made of an opaque material, the function is the same as that of the first light shielding portion 21.

Figure 11:
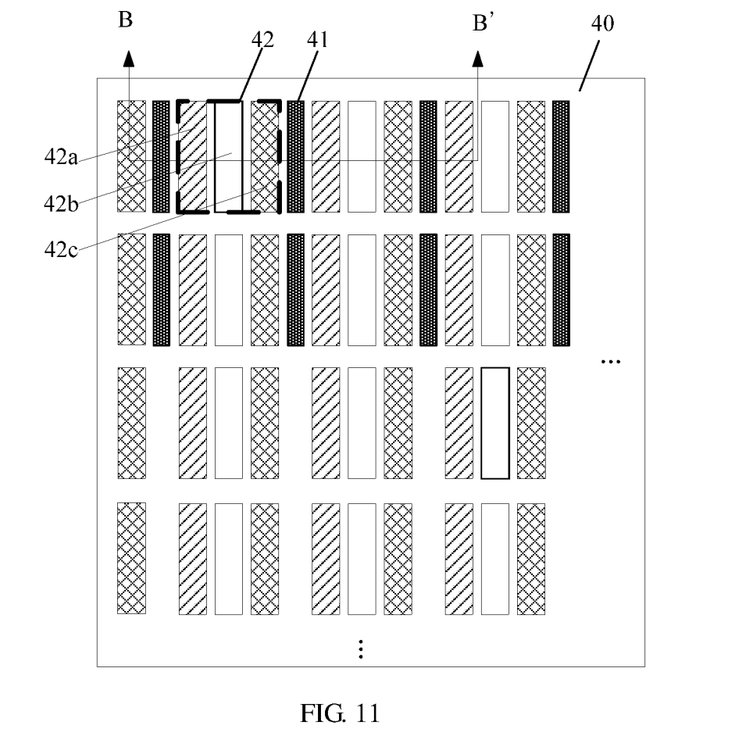
FIG. 11 is a top view of a display device according to an embodiment of the disclosure.
Figure 12:
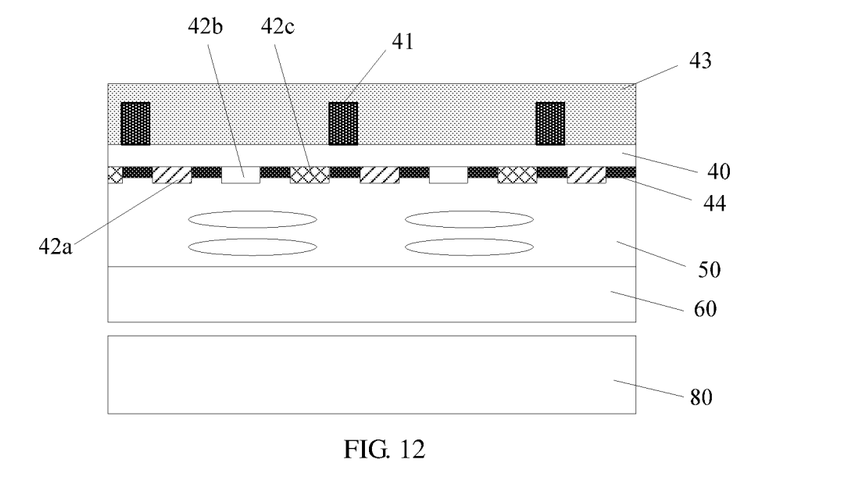
FIG. 12 is a cross-sectional view of the display device of FIG. 11 taken along line B-B'.

In at least some embodiments, as illustrated in FIGS. 11 to 12, the display substrate is a color filter substrate of an LCD, and the color filter substrate includes: a plurality of color filter units 42a, 42b, and 42c; and a black matrix 44 located between and configured to space the plurality of color filter units. The color filter substrate further includes a light shielding portion 41 located on a side of the base substrate 40 opposite to the black matrix 44 and the plurality of color filter units 42a, 42b, and 42c. For example, the light emitted from the backlight assembly 80 is incident on the color filter unit through the TFT substrate 60 and the liquid crystal layer 50, and then the light emitted from the color filter unit is emitted to the display side through the base substrate 40. The black matrix 44 and the plurality of color filter units are located on the light entrance side of the base substrate 40, and the light shielding portion 44 is located on the light exit side of the base substrate 40 or the display side of the display device. For example, the orthographic projection of the light shielding portion 41 on the plane of the base substrate 40 is located in the orthographic projection of the black matrix 44 on the plane of the base substrate 40, so that the light shielding portion 41 does not affect the aperture ratio of the display device. For example, the light shielding portion 44 is covered by the overcoat layer 43 for maintaining surface flatness.

In at least some embodiments, in order for the first light shielding portion 21 to play a light shielding role, the first light shielding portion 21 is formed of an opaque material, such as an insulating and opaque material.

In at least some embodiments, the higher the height of the first light shielding portion 21, the more large-angle light rays can be shielded. As illustrated in FIG. 4, among the light rays emitted from each sub-pixel of the first pixel unit 11, the light rays propagating in a direction perpendicular to the plane of the base substrate 10 is referred to as zero degrees light rays, and the light rays at other angles except 0 degrees are collectively referred to as large angle light rays (the line with arrows in FIG. 4 is the propagating direction of the light rays).

When the display substrate is applied to a display device, part of the large-angle light cannot be emitted from the display device because it is shielded by the first light shielding portion 21.

For example, the first light shielding portion 21 is disposed on the side of the pixel defining layer 23 of the OLED array substrate away from the base substrate 10, or the first light shielding portion 21 is disposed on the color filter substrate for forming an LCD, assuming that the first light shielding portion 21 can shield light rays emitted from the sub-pixel 11b at an angle of 60 to 90 degrees (e.g., angle α), when viewing the display screen at an angle of 60 to 90 degrees, the display screen viewed by the user is blurred due to low brightness, and thus the peep prevention function can be realized in the angle range of 60 to 90 degrees.

In at least some embodiments, the plurality of first light shielding portions are parallel to each other and each extend in a second direction (e.g., a column direction), the second direction is perpendicular to the first direction, and both the first direction and the second direction are located in a plane where the base substrate is located. In the column direction, the length of the first light shielding portion 21 may be greater than, equal to, or less than the length of the first pixel unit 11. For example, in the column direction, the length of the first light shielding portion 21 is greater than or equal to the length of the first pixel unit 11. In this way, along the column direction, the first light shielding portion 21 can shield more large-angle light emitted from the adjacent first pixel unit 11 or the sub-pixels of the first pixel unit 11.

For example, in the column direction, when the length of the first light shielding portion 21 is greater than the length of the first pixel unit 11, the first light shielding portion 21 may be of a block shape or a mesh shape, that is, a plurality of first light shielding portions are formed in one piece; in the column direction, when the length of the first light shielding portion 21 is equal to or smaller than the length of the first pixel unit 11, the first light shielding portion 21 may be of a block shape.

In this disclosure, the term "multiple rows of first pixel units 11" means that in multiple rows of pixel units, each row of pixel units consists of first pixel units 11. Similarly, "multiple rows of second pixel units 12" means that in multiple rows of pixel units, each row of pixel units consists of second pixel units 12. Because peeper often peeps at the display screen from the left and right sides of the display device, the row direction of the embodiment of the present disclosure corresponds to the lateral direction of the display device when viewing the display screen, that is, the horizontal direction when the display device is placed as illustrated in FIG. 1.

In at least some embodiments, each first pixel unit includes a plurality of sub-pixels, and the first light shielding portion is disposed between two adjacent sub-pixels of each first pixel unit. For example, as illustrated in FIG. 5, the first pixel unit 11 includes a plurality of sub-pixels 11a to 11c; in the row direction, a first light shielding portion 21 is provided between adjacent sub-pixels of the first pixel unit 11.

Figure 5:
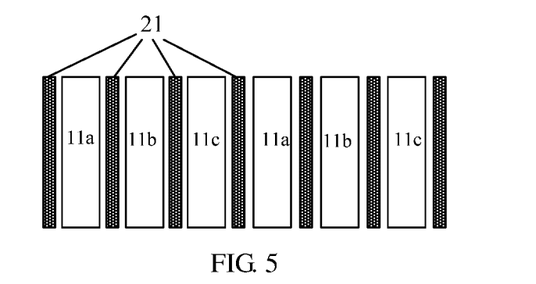
FIG. 5 is a top view of yet another display substrate provided by the embodiment of the disclosure.
Figure 6:
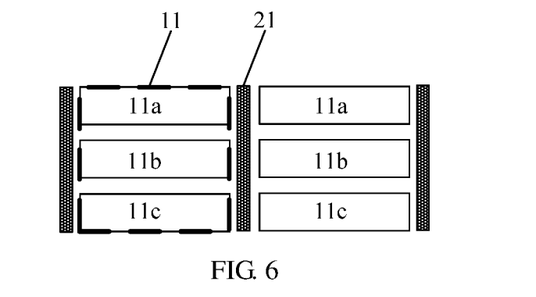
FIG. 6 is a top view of another display substrate provided by an embodiment of the disclosure.
Figure 7:
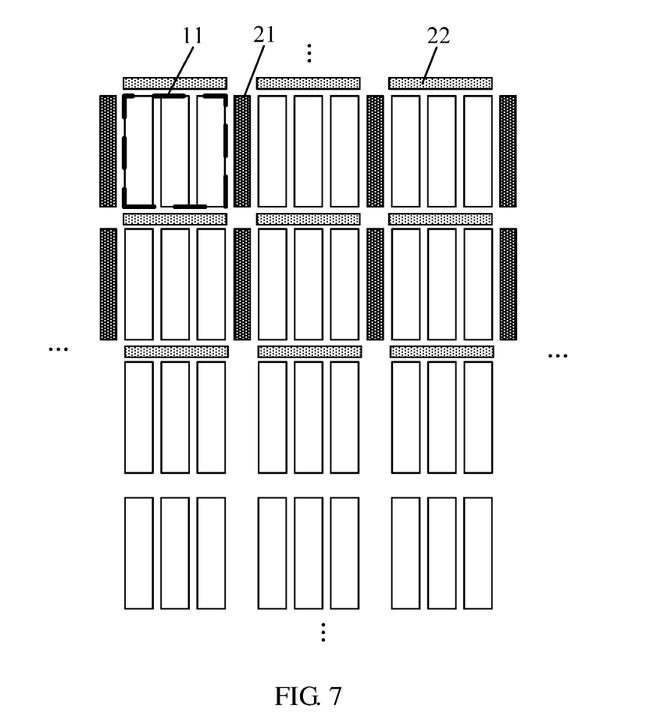
FIG. 7 is a top view of still another display substrate provided by the embodiment of the disclosure.

As illustrated in FIG. 5, when sub-pixels 11a to 11c in one first pixel unit 11 are arranged in the row direction, first light shielding portions 21 may be provided at every two adjacent sub-pixels of the first pixel unit 11, so that each first light shielding portion 21 shields large angle light emitted from sub-pixels of the first pixel unit 11 adjacent thereto. For another example, as illustrated in FIG. 6, when sub-pixels in one first pixel unit 11 are arranged in the column direction, the first light shielding portion 21 may not be provided between adjacent sub-pixels of the first pixel unit 11, because if peeping is prevented in the horizontal direction, the light shielding portion may not be provided in the vertical direction.

In the embodiment of the present disclosure, the first light shielding portion 21 is further provided between adjacent sub-pixels of the first pixel unit 11. Compared with providing the first light shielding portion 21 merely between adjacent first pixel units 11, the height of the first light shielding portion 21 can be reduced under the condition that the peep prevention angles of the two are the same, and further, the thickness of the display device can be reduced. It is also possible to increase the peep prevention angle of the display device when the heights of the first light shielding portions 21 of the two are the same.

In at least some embodiments, the height of the light shielding portion relative to the base substrate is greater than or equal to the distance from the center of the pixel unit closest to the light shielding portion to the light shielding portion.

Figure 10:
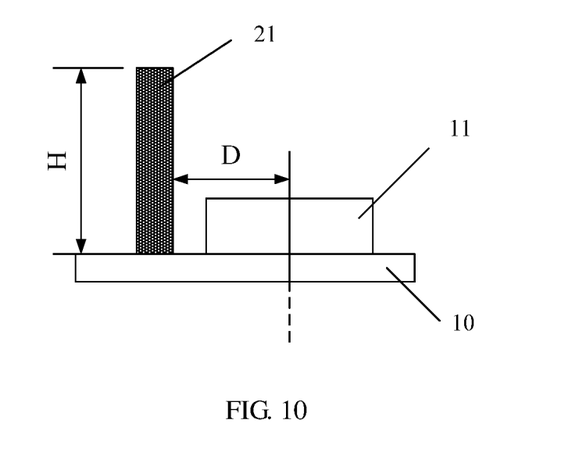
FIG. 10 is a cross-sectional view of a light shielding portion provided by an embodiment of the disclosure.

For example, as illustrated in FIG. 10, the height H of the light shielding portion 21 relative to the base substrate 10 is greater than or equal to the distance from the center of the pixel unit 11 closest to the light shielding portion 21 to the light shielding portion 21.

For example, in a case where the first light shielding portion 21 is located only between adjacent first pixel units 11, the sum of the thicknesses of the pixel defining layer 23 and the first light shielding portion 21 along the thickness direction of the base substrate 10 (i.e., the direction perpendicular to the plane in which the base substrate 10 is located) is greater than or equal to the vertical distance from the center of the first pixel unit 11 to the first light shielding portion 21 adjacent to the first pixel unit 11.

For example, in a case where the first light shielding portion 21 is located between adjacent first pixel units 11 and between adjacent sub-pixels of the first pixel unit 11, the sum of the thicknesses of the pixel defining layer 23 and the first light shielding portion 21 in the thickness direction of the base substrate 10 is greater than or equal to the vertical distance from the center of the sub-pixel of the first pixel unit 11 to the first light shielding portion 21 adjacent to the sub-pixel.

In the embodiment of the present disclosure, on the one hand, the first light shielding portion 21 and the pixel defining layer 23 can prevent at least part of large angle light rays greater than or equal to 45 degrees from exiting; on the other hand, when the first light shielding portion 21 and the pixel defining layer 23 can prevent the emitted large-angle light from being 45 degrees, it is convenient to set the total height of the first light shielding portion 21 and the pixel defining layer 23.

In the embodiment of the present disclosure, the plurality of first light shielding portions 21 are arranged in parallel. On the one hand, when forming a mask plate for preparing the plurality of first light shielding portions 21, the preparation process of the mask plate can be simplified; on the other hand, when a plurality of first light shielding portions 21 arranged in parallel are placed on the first pixel unit 11 or adjacent sub-pixels of the first pixel unit 11 on the display substrate, alignment can be made more accurate.

In at least some embodiments, the display device further includes a plurality of second light shielding portions, wherein each second light shielding portion is located between the first pixel unit and the pixel unit adjacent to the first pixel unit in a second direction, the second direction is perpendicular to the first direction, and both the first direction and the second direction are located in the plane of the base substrate.

For example, in the column direction, a second light shielding portion 22 is provided between the first pixel unit 11 and a pixel unit adjacent to the first pixel unit 11. In the column direction, the pixel unit adjacent to the first pixel unit 11 may be either the first pixel unit 11 or the second pixel unit 12.

In the embodiment of the disclosure, the display substrate can prevent the display device from peeping in the transverse direction, or prevent peeping in the longitudinal direction, or can prevent peeping in both the longitudinal direction and the transverse direction. The longitudinal direction of the display device refers to the vertical direction when the display substrate is placed as illustrated in FIG. 1.

Figure 8:
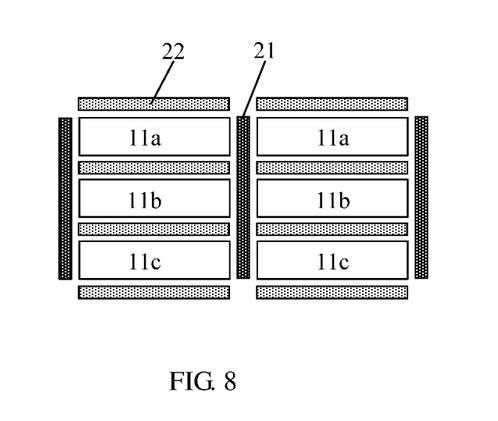
FIG. 8 is a top view of yet another display substrate provided by the embodiment of the disclosure.

For example, as illustrated in FIG. 8, when sub-pixels in one first pixel unit 11 are arranged in the column direction, second light shielding portions 22 may further be provided between sub-pixels of the first pixel unit 11 and between the first pixel unit 11 and a pixel unit adjacent to the first pixel unit 11.

In addition, those skilled in the art should know that when a display substrate is applied to a display device, the display substrate should include thousands or even tens of thousands of pixel units. In the drawings of the present invention, FIG. 1 to FIG. 3, FIG. 5 to FIG. 8 and FIG. 11 are schematic diagrams illustrating only some of pixel units on the display substrate.

The embodiment of the disclosure further provides a display device, which comprises the display substrate of any one of the previous embodiments, wherein the display substrate comprises: a base substrate; a plurality of pixel units located on the base substrate and including a plurality of first pixel units; and a light shielding portion positioned between two adjacent first pixel units.

In the above-mentioned display device, by arranging the light shielding portion between the adjacent first pixel units, a part of large-angle light can be shielded by the light shielding portion, so that the part of light cannot be emitted from the display device and applied to display. When the viewing angle of the user is within the angle range of the shielded light, the displayed picture becomes blurred due to too low brightness, thereby playing a peep prevention role at the viewing angle, so that the display device realizes peep prevention.

In at least some embodiments, as illustrated in FIG. 4, the display substrate is an organic electroluminescent array substrate, which includes: a plurality of organic electroluminescent units 24 located on the base substrate 10, and each organic electroluminescent unit 24 includes a sub-pixel region; and a pixel defining layer 23 configured to define a plurality of sub-pixel regions 11a, 11b, 11c of the organic electroluminescent unit; the light shielding portion 21 is located on the side of the pixel defining layer 23 away from the base substrate 10.

In at least some embodiments, as illustrated in FIG. 10, the display substrate is a color filter substrate, and the color filter substrate includes: a plurality of color filter units 42a, 42b, and 42c; and a black matrix 44 located between and configured to space the plurality of color filter units; wherein the light shielding portion 41 is located on the side of the base substrate 10 opposite to the black matrix 44 and the plurality of color filter units 42a, 42b and 42c.

The embodiment of the present disclosure further provides a peep prevention method of the display device as described in the previous embodiment, which comprises: lighting only the plurality of first pixel units so that the display device is in a peep-proof state.

In at least some embodiments, the peep prevention method further comprises: lighting all the plurality of pixel units so that the display device is in a normal display state.

For example, when the display device is turned on in the peep-proof mode, the first pixel unit 11 is in an operating state; when the display device is turned on in the non-peep-proof mode, at least other pixel units other than the first pixel unit 11 in the multi-row pixel units are in the working state.

Here, "other pixel units" refer to the second pixel units 12, wherein the first light shielding portion 21 is not provided between the second pixel units 12.

When the display device is turned on in the non-peep-proof mode, only the second pixel unit 12 can be in the working state, alternatively, both the first pixel unit 11 and the second pixel unit 12 can be in the working state, however, the latter has higher display brightness and resolution.

According to the peep prevention method of the display device provided by the embodiment of the disclosure, the display device can be switched between a peep-proof mode and a non-peep-proof mode according to the needs of users.

In this article, the following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness a layer or area may be enlarged or narrowed, that is, the drawings are not drawn in a real scale.

(3) In case of no conflict, features in one embodiment or in different embodiments can be combined.

The above description is merely an exemplary embodiment of the present disclosure and is not intended to limit the scope of protection of the present disclosure, which is determined by the appended claims.

What is claimed is:

1. A display substrate comprising:
a base substrate;
a plurality of pixel units on the base substrate, the plurality of pixel units comprising a plurality of first pixel units; and
a light shielding portion between two adjacent first pixel units,
wherein the plurality of pixel units further comprise a plurality of second pixel units, and the light shielding portion is not provided between two adjacent second pixel units.

2. The display substrate according to claim 1, wherein the light shielding portion comprises a plurality of first light shielding portions, wherein the plurality of first pixel units are arranged in a first direction, and each first light shielding portion is located between two adjacent first pixel units arranged in the first direction.

3. The display substrate according to claim 2, wherein each first pixel unit comprises a plurality of sub-pixels, and the first light shielding portion is disposed between two adjacent sub-pixels of each first pixel unit.

4. The display substrate according to claim 2, wherein the plurality of first light shielding portions are parallel to each other and extend in a second direction, the second direction is perpendicular to the first direction, and the first direction and the second direction are both located in a plane of the base substrate.

5. The display substrate according to claim 4, wherein the first light shielding portion extends in the second direction, and a length of the first light shielding portion in the second direction is greater than or equal to a length of the first pixel unit in the second direction.

6. The display substrate according to claim 4, wherein the first direction is a row direction and the second direction is a column direction, and the plurality of pixel units comprise a plurality of rows of first pixel units and a plurality of rows of second pixel units, and the second pixel units and the first pixel units are alternately arranged in the column direction.

7. The display substrate according to claim 4, wherein the first direction is a row direction and the second direction is a column direction, and the plurality of pixel units comprise a plurality of rows of first pixel units and a plurality of rows of second pixel units, the plurality of rows of first pixel units are adjacent to each other in the column direction, and the plurality of rows of second pixel units are adjacent to each other in the column direction.

8. The display substrate according to claim 2, further comprising a plurality of second light shielding portions, wherein each second light shielding portion is located between the first pixel unit and a pixel unit adjacent to the first pixel unit in a second direction, the second direction is perpendicular to the first direction, and both the first direction and the second direction are located in a plane of the base substrate.

9. The display substrate according to claim 8, wherein the second light shielding portion extends in the first direction, and a length of the second light shielding portion in the first direction is greater than or equal to a width of the first pixel unit in the first direction.

10. The display substrate according to claim 1, further comprising: a pixel defining layer on the base substrate, the pixel defining layer is configured to define a plurality of sub-pixel regions, and the light shielding portion disposed on a side of the pixel defining layer away from the base substrate.

11. The display substrate according to claim 10, wherein the light shielding portion is only located between the two adjacent first pixel units, and a sum of thicknesses of the pixel defining layer and the light shielding portion in a direction perpendicular to a plane of the base substrate is greater than or equal to a distance from the light shielding portion to a center of the first pixel unit closest to the light shielding portion.

12. The display substrate according to claim 10, wherein the light shielding portion is located between the two adjacent first pixel units and between two adjacent sub-pixels of each first pixel unit, and a sum of thicknesses of the pixel defining layer and the light shielding portion in a direction perpendicular to a plane of the base substrate is greater than or equal to a distance from a center of a sub-pixel of the first pixel unit to the first light shielding portion closest to the sub-pixel.

13. The display substrate according to claim 1, wherein a height of the light shielding portion relative to the base substrate is greater than or equal to a distance from a center of the pixel unit closest to the light shielding portion to the light shielding portion.

14. A display device, comprising a display substrate, the display substrate comprising:
a base substrate;
a plurality of pixel units on the base substrate, the plurality of pixel units comprising a plurality of first pixel units; and
a light shielding portion between two adjacent first pixel units,
wherein the plurality of pixel units further comprise a plurality of second pixel units, and the light shielding portion is not provided between two adjacent second pixel units.

15. The display device according to claim 14, wherein the display substrate is an organic electroluminescent array substrate, and the organic electroluminescent array substrate comprises:
a plurality of organic electroluminescent units on the base substrate, and each organic electroluminescent unit comprising a sub-pixel region; and
a pixel defining layer configured to define a plurality of sub-pixel regions of the organic electroluminescent unit;
wherein the light shielding portion is located at a side of the pixel defining layer away from the base substrate.

16. The display device according to claim 15, wherein an orthographic projection of the light shielding portion on the base substrate is within an orthographic projection of the pixel defining layer on the base substrate.

17. The display device according to claim 14, wherein the display substrate is a color filter substrate, and the color filter substrate comprises:
a plurality of color filter units; and
a black matrix located between the plurality of color filter units and configured to space the plurality of color filter units;
wherein the light shielding portion is on a side of the base substrate opposite to the black matrix and the plurality of color filter units.

18. A peep prevention method for a display device, the display substrate comprising:
a base substrate;
a plurality of pixel units on the base substrate, the plurality of pixel units comprising a plurality of first pixel units; and
a light shielding portion between two adjacent first pixel units,
wherein the plurality of pixel units further comprise a plurality of second pixel units, and the light shielding portion is not provided between two adjacent second pixel units,
the peep prevention method comprising:
lighting only the plurality of first pixel units to make the display device in a peep-proof state.

19. The peep prevention method of the display device according to claim 18, further comprising:
lighting all the plurality of pixel units to make the display device in a normal display state.

* * * * *